(12) United States Patent
Perner (10) Patent No.: US 7,385,837 B2
(45) Date of Patent: Jun. 10, 2008

(54) NONVOLATILE MEMORY CELL AND METHODS FOR OPERATING A NONVOLATILE MEMORY CELL

(75) Inventor: Martin Perner, Munich (DE)

(73) Assignee: Infineon Technologies AG, Munich (DE)

(*) Notice: Subject to any disclaimer, the term of this patent is extended or adjusted under 35 U.S.C. 154(b) by 313 days.

(21) Appl. No.: 11/241,879

(22) Filed: Sep. 30, 2005

(65) Prior Publication Data

US 2006/0083050 A1   Apr. 20, 2006

(30) Foreign Application Priority Data

Sep. 30, 2004   (DE) .................. 10 2004 047 638

(51) Int. Cl.
*G11C 11/00*   (2006.01)
(52) U.S. Cl. .......................... 365/148; 365/63
(58) Field of Classification Search ................. 365/148, 365/63
See application file for complete search history.

(56) References Cited

U.S. PATENT DOCUMENTS

| | | | |
|---|---|---|---|
| 6,545,899 B1 | 4/2003 | Derner et al. | |
| 6,704,676 B2 | 3/2004 | Boldt | |
| 6,895,538 B2 | 5/2005 | Benedix et al. | |
| 6,914,806 B2 | 7/2005 | Kunikiyo | |
| 7,184,301 B2* | 2/2007 | Sugibayashi et al. | 365/158 |
| 7,190,608 B2* | 3/2007 | Williford et al. | 365/148 |
| 7,251,152 B2* | 7/2007 | Roehr | 365/100 |
| 7,254,052 B2* | 8/2007 | Liaw | 365/148 |
| 2004/0057271 A1 | 3/2004 | Parkinson | |
| 2007/0211519 A1* | 9/2007 | Thomas et al. | 365/154 |

FOREIGN PATENT DOCUMENTS

| | | |
|---|---|---|
| DE | 38 86 600 T2 | 7/1994 |
| DE | 698 00 188 T2 | 3/2001 |
| DE | 100 34 878 A1 | 3/2002 |
| DE | 101 02 349 C1 | 8/2002 |
| DE | 102 56 977 A1 | 10/2003 |
| WO | WO 03/050816 A1 | 6/2003 |

* cited by examiner

*Primary Examiner*—Tuan T. Nguyen
(74) *Attorney, Agent, or Firm*—Slater & Matsil, L.L.P.

(57) ABSTRACT

A nonvolatile memory cell (1) can be integrated in space-saving fashion into a semiconductor circuit (10) intended for volatile storage with the aid of volatile memory cells (2). The memory cell (1) has a programmable component (3) having an electrical resistance that can be altered by reprogramming, and also first (8) and second switching elements (9), which switch a first current path (J1) or a second current path (J2) in conducting fashion upon activation of optionally a first (11) or a second word line (12). At least one of the two current paths leads via the programmable component (3). Potentials of two bit lines (21, 22) to which the memory cell (1) according to the invention is connected can be altered as a result of the first or the second current path (J1, J2) being activated temporarily. The memory cell (1) permanently stores an item of digital information and can be driven by word lines (11, 12) and bit lines (21, 22) such as are conventionally used in volatile semiconductor memories (10). The invention opens up the possibility of integrating volatile and nonvolatile memory cells into a common memory cell array.

22 Claims, 4 Drawing Sheets

NONVOLATILE MEMORY CELL AND METHODS FOR OPERATING A NONVOLATILE MEMORY CELL

This application claims priority to German Patent Application 10 2004 047 638.1, which was filed Sep. 30, 2004, and is incorporated herein by reference.

TECHNICAL FIELD

The invention relates to a nonvolatile memory cell and method for operating a non-volatile memory cell.

BACKGROUND

In the case of integrated semiconductor memories, a distinction is made between volatile semiconductor memories and nonvolatile semiconductor memories. Nonvolatile semiconductor memories store the items of information even after the operating voltage has been switched off. Nonvolatile semiconductor memories may be EEPROMs (electrically erasable programmable read only memories), for example. By contrast, volatile semiconductor memories store the items of information only during their operation until the operating voltage is switched off. Even during operation, stored items of information continually have to be refreshed again since they are otherwise lost through leakage currents despite the operating voltage being maintained. Thus, by way of example, memory cells of DRAMS (dynamic random access memories) are in each case read and rewritten in amplified fashion (refreshing) after a few or a few dozen milliseconds, since it is only during this refresh time that error-free storage of the items of information is ensured.

Volatile memory cells have the advantage that they require little substrate area and can be arranged densely on a semiconductor chip. Memory cells of DRAMs, for instance, can be realized just with a storage capacitor, for example in the form of a trench capacitor or a stacked capacitor, and a selection transistor connected to in each case a word line and a bit line.

Volatile memory cells and nonvolatile memory cells are usually accommodated on different semiconductor chips. Although there is the need to permanently store certain items of information in the case of nonvolatile semiconductor memories, too, storing these items of information would necessitate nonvolatile memory cells on the memory chip of the volatile semiconductor memory, which can conventionally be realized at best by an additional memory cell array for nonvolatile memory cells or by a very small number of fuses or antifuses arranged outside the cell array of the volatile memory cells. In the case of an additional memory cell array for nonvolatile memory cells, however, it is necessary to effect dedicated driving of the additional memory cell array by means of word lines and bit lines including the corresponding drivers and the other electrical control circuits. On account of the disproportionately large additional amount of area taken up on the semiconductor substrate, such an additional nonvolatile memory cell array on a memory chip for the volatile semiconductor memory is dispensed with in most cases. Instead, only the most necessary items of information, namely usually only the identification designator of the respective semiconductor chip, are stored with the aid of laser fuses on the volatile memory chip. By contrast, other items of information, for instance the test results originating on account of an electrical functional test carried out with the aid of the volatile memory device, for instance test errors that occurred or the positions or numbers of replaced word or bit lines or test parameters such as temperatures, current values, trimming values, burn-in test time durations or the like, are not stored on the fabricated and then tested semiconductor chip, even though this would actually be desirable.

Consequently, there is a requirement for integrated volatile semiconductor memories that additionally afford the possibility of storing a relatively large quantity of data permanently, that is to say in nonvolatile fashion. In particular, there is a requirement for a memory cell that in conjunction with little additional occupancy in terms of substrate area being taken up, enables nonvolatile storage of as many digital items of information of the semiconductor memory as possible.

SUMMARY OF THE INVENTION

Therefore, the embodiments of the present invention provide a nonvolatile memory cell that can be integrated in a space-saving fashion into a memory chip of a volatile semiconductor memory. The nonvolatile memory cell is intended to be integrable as far as possible into a cell array having a multiplicity of volatile memory cells. Furthermore, embodiments of the present invention provide methods for operating such a nonvolatile memory cell.

In a first embodiment, a nonvolatile integrated memory cell includes a programmable component, the electrical resistance of which depends on its programming state, including at least one first switching element, which has a control electrode connected to a first word line, including at least one second switching element, which has a control electrode connected to a second word line. The memory cell is connected to at least one of two bit lines. The at least one first switching element opens a first current path when the first word line is activated. The first current path leads from one of the two bit lines via the programmable component as far as a first potential terminal. The at least one second switching element opens a second current path when the second word line is activated. The second current path leads from one of the two bit lines as far as a second potential terminal.

Embodiments of the invention propose a nonvolatile memory cell that can be connected to, in each case, two word lines and at least one of two bit lines, in which case the word lines and the bit lines may be those lines such as are provided in a memory cell array for driving volatile memory cells. Preferably, a multiplicity of volatile memory cells are, in each case, connected at least to the bit lines. The memory cell can simultaneously be connected to the same bit line and can, therefore, also be operated with the bit line drivers and bit line potentials and control circuits that are customary in a volatile memory in order to permanently store an item of information in the additionally connected nonvolatile memory cell, the item of information remaining permanently stored even after the volatile memory cells connected to the bit line have been switched off. The word lines, too, may be formed in the same way as the word lines connected to the volatile memory cells, but some of these word lines may be provided exclusively for driving nonvolatile memory cells according to the invention and others of these word lines may be provided exclusively for driving the volatile memory cells.

The memory cell according to embodiments of the invention can thus be driven by the same type of word lines and bit lines as is already provided in a volatile memory cell array. In contrast to the volatile memory cells, however, the nonvolatile memory cell proposed according to embodiments of the invention is simultaneously connected to two word lines. Furthermore, it is simultaneously connected to up to two bit lines, as will be explained below on the basis of the individual exemplary embodiments.

According to embodiments of the invention, the nonvolatile memory cell has a programmable component, the electrical resistance of which depends on its programming state. In particular, the programmable component has two different programming states that are interpreted as logic "1" and logic "0". The nonvolatile memory cell can furthermore have at least one first switching element, which is connected to a first word line, and also at least one second switching element, which is connected to a second word line. The first switching element has the effect that when the first word line is activated, a first current path leading from one of the two bit lines via the programmable component as far as a first potential terminal is switched in conducting fashion. Consequently, when the first word line is activated, the first switching element enables an electrical connection between the respective bit line and a first potential terminal, via which electrical connection a current can flow whose current intensity depends on the magnitude of the electrical resistance of the programmable component. As a result, depending on the programming state of the component, it is possible to effect a change in the potential of that bit line that is connected to the first potential terminal via the first current path.

Furthermore, embodiments of the invention provides for the second switching element to switch a second current path in conducting fashion when the second word line is activated, the current path leading from one of the two bit lines as far as a second potential terminal. Consequently, two different current paths, at least the first current path of which leads via the programmable component, can be opened in the nonvolatile memory cell according to embodiments of the invention. The first or the second current path is switched in conducting fashion depending on which of the two word lines is activated.

According to embodiments of the invention, the "activation" of a word line is to be understood to mean that the corresponding word line is biased such that switching elements connected to the respective word line, such as MOSFETs (metal oxide semiconductor field effect transistor), for example, are switched into the on state, thereby enabling the respective current path. The activation of one word line or the other thus simultaneously brings about the activation of one current path or the other, in which case the fact of whether and with what magnitude a current flows along the respective current path depends on the programming state of the component and the electrical resistance of the component that prevails in this state. Independently of the magnitude of the electrical resistance of the component, however, the activation of the respective word line has the effect that the corresponding current path is activated via the respective switching element.

It is preferably provided that the programmable component is at high impedance in a first programming state and at low impedance in a second programming state. The terms "first programming state" and "second programming state" are not to be understood in the sense of a temporal order, but rather merely in the sense of an enumeration of possible programming states. Which of the two states is present first in temporal terms depends on the type of component. The programming component may be a one-time only irreversibly programmable component, for example an electrically programmable fuse or antifuse. As an alternative to this, the programmable component may be a repeatedly reversibly reprogrammable component.

The programmable component may have, for example, a magnetic memory medium or a phase change medium. In principle, any type of programmable components that are also used conventionally in nonvolatile memories for storing items of digital information are appropriate for the memory cell according to embodiments of the invention. By way of example, magnetic memories having layer sequences comprising ferromagnetic and/or antiferromagnetic layers may be incorporated into the memory cell according to embodiments of the invention as a programmable component.

Equally, phase change memories having a memory medium present in two different phases, that is to say solid states, depending on the ambient temperature may also be provided as a programmable component in the memory cell according to embodiments of the invention. In the case of a phase change medium, the electrical resistance thereof depends on the solid state of the phase change medium. The electrical resistance is lower in a crystalline state than in an amorphous state. Phase change media and nonvolatile memories operated therewith are known. In the case of a phase change medium, a reprogramming is achieved by firstly heating the phase change medium to a temperature at which the phase change medium becomes amorphous. Depending on the duration and speed of a subsequent cooling process, the phase change medium either remains amorphous or becomes crystalline. The phase-dependent magnitude of the electrical resistance of the cooled phase change medium serves as memory information.

Particularly in the case of a one-time only irreversibly programmable component, it may be provided that the programmable component is current-impervious in the high-impedance programming state.

With regard to the cell-internal construction of the nonvolatile memory cell according to embodiments of the invention, in accordance with a first embodiment it is preferably provided that the first current path leads from the first bit line to the first potential terminal and the second current path leads from the second bit line to the second potential terminal. In this embodiment, the memory cell is connected to two bit lines. A respective bit line is connected to a potential terminal by a current path provided that the respective current path is activated by the corresponding switching element. Consequently, each of the two bit lines can be brought to an altered bit line potential by the memory cell according to embodiments of the invention. The potential difference between the potentials of the two bit lines also varies as a result.

It is preferably provided that both current paths lead via the programmable component, the programmable component being connected in series between two first switching elements in the first current path and being connected in series between two second switching elements in the second current path. In this case, both current paths lead via the programmable component, so that the magnitude of the flowing current is dependent on the electrical resistance of the programmable component in each current path. However, the electrical resistance of the component can be converted into an electrical signal in different ways through each current path.

It is preferably provided that the first and the second bit line are connected to a differential amplifier, which amplifies a difference between the electrical potentials of the first and of the second bit line and which provides a first and a second potential at two output terminals. This exploits the fact that the nonvolatile memory cell according to embodiments of the invention is configured such that it can be operated with the aid of the bit lines, word lines and differential amplifiers (also called sense amplifiers or signal amplifiers) that are already present in a conventional volatile memory cell array. In particular, this exploits the fact that usually, in a DRAM, in each case two bit lines are connected to a signal amplifier that detects the electrical potentials of the two bit lines as input signal and rewrites the difference between them onto the bit lines in amplified fashion, thereby having the effect that two bit line potentials of the bit lines that initially differ only slightly from one another become removed from one another when the differential amplifier is activated. The memory cell according to embodiments of the invention can thus be connected to two bit lines that are connected to the same differential amplifier and the potentials of which are influenced by the differential amplifier.

It is preferably provided that the two current paths are assigned to the two output terminals of the differential amplifier such that an existing potential difference between the potentials of the first and of the second bit line is inverted by the second current path when the programmable component is switched in low-impedance fashion. In a conventional memory cell array of a DRAM, the bit line signals (in particular the deviations of the bit line potentials from the precharge potential, which amounts to half of the maximum possible bit line potential, of a bit line pair are amplified, but not inverted, by the differential amplifier. In the nonvolatile memory cell according to embodiments of the invention, however, the two current paths make it possible to produce an electrical connection between the output terminals of the differential amplifier and the bit lines, as a result of which the bit line potentials are inverted. As a result, in the case of a first bit line that stores a logic "1", for example, and a second bit line that stores a logic "0" in this case, it is possible to interchange the assignment of these items of digital information to the bit lines. Such inversion of bit line potentials can be used to reprogram the programmable component with the aid of the first current path or to identify and indicate an altered programming state with the aid of the second current path in the case of a component programmed in low-impedance fashion.

It is preferably provided that the first and the second potential terminal are the output terminals of the differential amplifier. Consequently, the respective current paths are connected directly or indirectly to the output terminals of the differential amplifier. Each current path thus connects an output terminal of the differential amplifier to a bit line.

It is preferably provided that the second current path contains a protective resistor, which prevents a programming of the programmable component via the second current path. Since both current paths lead via the programmable component, but the second current path additionally contains a protective resistor, the current flowing through the component is lower in the case of the second current path than in the first current path (provided that in each case the same potential difference is applied to the opposite ends of the respective current path). In the case of the second current path, the additional protective resistor keeps the current flowing through the component so low that the current intensity required for reprogramming is not exceeded. In particular, in this embodiment, the memory cell can be operated with two word lines that are driven by in each case identical word line parameters, in particular identical word line potentials. If need be, the control timing during the operation of the first and second word lines may be chosen differently, if appropriate, in order to enable a different type of access to the nonvolatile memory cell than in the case of volatile memory cells.

It is preferably provided that the first current path contains a rectifier diode, which permits a programming of the programmable component via the first current path only in one current direction. What is thereby achieved is that only the writing of a logic "1" leads to a reprogramming of the component, but not the application of potentials that would correspond to the writing of a logic "0".

With regard to the cell-internal construction of the nonvolatile memory cell according to embodiments of the invention, provision is made, in accordance with a second, alternative embodiment, for both current paths, proceeding from the same bit line, to lead to in each case one of the two potential terminals. In this case, the memory cell is situated in the region of two bit lines, but is only connected to one of the two bit lines. Depending on which of the two word lines to which the memory cell is connected is open, the bit line is optionally connected to the first potential terminal via the first current path or to the second potential terminal via the second current path. Consequently, the potential of the bit line can be altered in different ways depending on which of the two current paths is activated.

It is preferably provided that the first current path leads via the programmable component and the second current path leads via a load resistor instead of via the programmable component. Moreover, it may also preferably be provided that the electrical resistance of the load resistor is less than that of the programmable component in the high-impedance programming state, but greater than that of the programmable component in the low-impedance programming state. In particular, only the first current path leads via the programmable component. The second current path does not lead via the programmable component, but rather the load resistor. Depending on the programming state of the component, the electrical resistance thereof is greater or less than the load resistor. Furthermore, the current paths are connected to potential terminals biased with potentials having different magnitudes. As a result, it is possible with the aid of one current path to achieve an increase and with the aid of the other current path to achieve a decrease in the potential of the bit line to which the memory cell is connected, depending on the choice of current path.

It is preferably provided that the first current path connects the first bit line to the first potential terminal and the second current path connects the first bit line to the second potential terminal, the two potential terminals being biased during operation of the memory cell such that the magnitude of the potential of the first bit line lies between the potential of the first potential terminal and the potential of the second potential terminal. Consequently, the potential of the first potential terminal is greater than the potential of the first bit line and the potential of the second potential terminal is less than the potential of the first bit line, or vice versa. The bit line potential can either be increased or decreased depending on the potential terminal to which the first bit line is connected via the respective current path. In particular, it is possible, as will be explained later, during the operation of the memory cell according to embodiments of the invention, to combine an increase in the bit line potential and a decrease in the bit line potential with one another in order to read out the tendency of the overall resultant change in the potential of the bit line as digital information of the memory cell.

It is preferably provided that the nonvolatile memory cell is integrated into a volatile semiconductor memory, to be precise in particular in or alongside a cell array in which a multiplicity of volatile memory cells are provided.

In particular, it may be provided that the nonvolatile memory cell is connected to at least one of two bit lines to which a multiplicity of volatile memory cells are connected in each case. It is particularly preferred for the nonvolatile memory cell to be connected to two bit lines leading from the volatile memory cells to two input terminals of a differential amplifier and to be arranged between the volatile memory cells and the differential amplifier. Consequently, the nonvolatile memory cell according to embodiments of the invention can be arranged on a volatile semiconductor memory between a series of signal amplifiers and an arrangement of volatile memory cells, as a result of which only very little substrate area is additionally taken up.

One embodiment of the invention proposes a first method for operating a nonvolatile memory cell. In accordance with this method, the programmable component of the memory cell according to embodiments of the invention is programmed by the first word line being activated and the first current path thereby being switched in conducting fashion. The first word line thus serves for altering the programming state of the programmable component, that is to say that it thus serves as a writing word line. The second word line may be referred to as a reading word line since it is not used for reprogramming the programmable component. As a result of the activation of the first word line, the first current path is activated, as a result of which a current can flow through the component provided that it permits current to pass in its present programming state. Given a sufficient time duration during which the first word line remains activated, the component is reprogrammed. By way of example, a corresponding programming current causes a fuse to be switched into a blocking state or an antifuse to be switched into a conducting state.

It is preferably provided that in order to program the programmable component, that bit line that is connected to one end of the first current path is biased such that the differential amplifier biases that potential terminal that is connected to another end of the first current path such that the difference between the potentials of the bit line and of the potential terminal is greater than a programming voltage for reprogramming the component. By way of example, a first bit line biased with a high potential is connected to a first potential terminal biased with a small negative potential through the first current path. The potential difference then lies above the programming voltage by means of which the programming element is reprogrammed.

Embodiments of the invention furthermore propose a second method for operating the nonvolatile memory cell. In the case of this second memory, the memory cell is read by the second word line being activated and the second current path thereby being switched in conducting fashion. In the second current path, the current intensity, on account of the additional protective resistor, is lower than the programming voltage of the programmable component, so that the second word line is suitable as a reading word line.

It is preferably provided that prior to the activation of the second word line, the first bit line is momentarily brought to a different potential than that of the second bit line and the difference between the potential of the two bit lines is amplified by the differential amplifier, and then the second word line remains activated until it is established whether or not the difference between the potentials of the two bit lines is inverted by the second current path leading via the programmable component. In this case, firstly biasing of the first bit line generates a potential difference between the potentials of the input terminals of the differential amplifier to which the two bit lines are connected. The potential difference is amplified by the differential amplifier. Only then is the second bit line activated during a time duration that is long enough to invert the voltage difference between the two bit lines with respect to one another when the programmable component is programmed in low-impedance fashion. If, by contrast, the component is programmed in high-impedance fashion, the bit line potentials are not inverted. The programming state of the programmable component can be identified from this.

Accordingly, it is preferably provided that a logic "1" number or a logic "0" number is read out depending on whether or not the difference between the potentials of the two bit lines is inverted by the second current path leading via the programmable component (or vice versa).

The invention furthermore proposes a third embodiment method for operating a nonvolatile memory cell. The memory cell is read by activating:

the first word line during a first time duration, as a result of which the first current path is temporarily coupled to one of the two bit lines.

Then, the second word line can be activated during a second time duration, as a result of which the second current path is temporarily coupled to one of the two bit lines, and The difference between the potentials of the two bit lines can then be amplified.

This method makes it possible, in particular, to read a memory cell in the case of which only one of the two current paths leads via the programmable component. The amplification of the potential difference between the two bit lines is achieved for example with the aid of a differential amplifier. In the case of the method according to embodiments of the invention, however, beforehand the first word line is activated during a first time duration and, after the latter has elapsed, the second word line is activated during a second time duration, as a result of which firstly the first current path and then the second current path is opened temporarily. As a result of the opened current paths, the potential of the respectively connected bit line is altered, and the respective potential alteration is dependent on the electrical resistance along the current path and on the time duration for which the respective current path remains opened. The lower the resistance along the respective current path, the greater the change in potential obtained. Furthermore, the change in potential is greater, the greater also the time duration during which the respective current path is activated.

It is preferably provided that the difference between the potentials of the two bit lines is amplified by the differential amplifier.

Furthermore, it is preferably provided that firstly the first word line and then the second word line is activated temporarily. However, it is equally possible for firstly the second word line and then the first word line to be activated temporarily. During the operation of the memory cell according to embodiments of the invention, the word lines are not activated permanently, but rather only ever for a limited period of time in order to avoid permanently high or higher currents through the programmable component that might result in unintentional reprogramming.

It is preferably provided that the first and the second potential and the first and the second time duration are chosen such that, through the current paths that are temporarily connected to the respective bit line, they bring about changes in the potential of the respective bit line which are dimensioned such that when the programmable component is programmed in the first state, after the activation of the two word lines one after the other, the potential of the first bit line is greater than the potential of the second bit line, and when the programmable component is programmed in the second state, after the activation of the two word lines one after the other, the potential of the first bit line is less than the potential of the second bit line, or vice versa.

In this embodiment, two changes in potential are effected successively by virtue of a respective one of the bit lines being connected to a biased potential terminal through one of the current paths. Depending on the magnitude of the electrical resistance in the respective current path, a large or a small change in the potential of the respectively connected bit line arises. In particular, this exploits the fact that no or only a very small change in potential occurs in the case of a component programmed in high-impedance fashion, whereas a comparatively large change in potential occurs in the case of a component programmed in low-impedance fashion. If only the first current path leads via the programmed component, the change in potential brought about through the first current path is larger or smaller in magnitude than the magnitude of the opposite change in potential brought about by means of the second current path, to be precise in a manner dependent on whether the component is programmed in high-impedance or low-impedance fashion. Consequently, depending on the programming state of the component, the net effect of the two changes in potential is greater or less than zero and overall brings about either a potential increase or a potential decrease. This net effect is thus evaluated as digital information.

By way of example, in the type of embodiment described here, the bit line potential of the first bit line is greater than that of the second bit line if the component is programmed in the first programming state. By contrast, a component programmed in the second programming state has the effect that when the word lines have been activated temporarily one after the other, the potential of the first bit line is less than the potential of the second bit line. As an alternative to this, the end potential of the first bit line may also be less than that of the second bit line in the case of the first programming state and greater than that of the second bit line in the case of the second programming state.

The potentials with which the two potential terminals are biased and the time duration during which the first and second word lines are activated are chosen such that the first current path brings about a change in potential that is greater in magnitude than the second current path in the case of a component programmed in low-impedance fashion, and brings about a change in potential that is smaller in magnitude than the second current path in the case of a component programmed in high-impedance fashion. In this case, only the first current path leads via the programmed component. By contrast, the second current path leads via a load resistor.

It is preferably provided that both current paths are coupled to the first bit line by the respective switching elements, and through the first current path the potential of the first bit line is increased at least when the programmable component is programmed in a low-impedance state, and through the second current path the potential of the first bit line is reduced (or vice versa).

Consequently, the first and the second current path can be connected to in each case the same (for example the first) bit line, depending on whether the first or the second switching element is switched into the on state. The potential of the first bit line is increased by means of the first current path and reduced by means of the second current path (or vice versa). Depending on whether the programmed component arranged in the first current path is at low impedance or at high impedance, the increase or the decrease in the potential of the first bit line is predominant. Thus, depending on the programming state of the component, the potential of the first bit line is either greater or less than before after the two current paths have in each case been activated temporarily one after the other.

It is preferably provided that the second time duration is chosen to be greater than the first time duration. By way of example, in order to read from the memory cell, firstly the first word line is activated momentarily and then the second word line is activated over a longer period of time, but only after the first word line has already been deactivated again. The only momentary activation of the first word line prevents unintentional reprogramming of the component.

It is preferably provided that the second time duration is chosen with a length such that the potential of the first bit line, since it has not been increased or has been increased only slightly through the first current path with component programmed in high-impedance fashion, is lowered to a potential value that is less than the potential of the first bit line at the instant directly before the activation of the first current path. In this case, the second current path, if it is activated, is activated for a length of time such that the decrease in the potential of the first bit line that is caused as a result is greater in magnitude than the previous increase in the potential of the first bit line through the first current path, though only when the component is programmed in high-impedance fashion.

Accordingly, it is provided that the first time duration and the second time duration are chosen such that the first current path, with component programmed in low-impedance fashion, brings about an increase in the potential of the first bit line having a magnitude such that when the second word line is activated, the potential of the first bit line no longer falls below the potential assumed by the first bit line at the instant directly before the activation of the second current path. In the case of a component programmed in low-impedance fashion, the potential increase achieved by means of the first current path is thus predominant over the potential decrease subsequently brought about by means of the second current path. Depending on the programming state of the component, the potential of the first bit line is either greater or less than before after the two word lines have in each case been activated temporarily one after the other.

Finally, embodiments of the invention provide an integrated semiconductor memory comprising a memory cell array having a multiplicity of volatile memory cells and at least one nonvolatile memory cell.

BRIEF DESCRIPTION OF THE DRAWINGS

Embodiments of the invention are described below with reference to the figures, in which.

The following list of reference symbols can be used in conjunction with the figures:

| | |
|---|---|
| 1 | Nonvolatile memory cell |
| 2 | Volatile memory cell |
| 3 | Programmable component |
| 4 | Protective resistor |
| 5 | Rectifier diode |
| 6 | Load resistor |
| 7 | Differential amplifier |
| 7a | Input terminal |
| 7b | Output terminal |
| 8 | First switching element |
| 9 | Second switching element |
| 10 | Semiconductor memory |
| 11 | First word line |
| 12 | Second word line |
| 13, 14 | Further word lines |
| 17 | Magnetic memory medium |
| 18 | Phase change medium |
| 21 | First bit line |
| 22 | Second bit line |
| 25 | Memory cell array |
| A, B | Programming states |
| J1 | First current path |
| J2 | Second current path |
| R3a, R3b | Electrical resistance of the component |
| R6 | Electrical resistance of the load resistor |
| t | Time |
| t1, . . . , t4 | Instants |
| tpg | Third time duration |
| trd | Second time duration |
| twr | First time duration |
| U1 | First potential terminal |
| U2 | Second potential terminal |
| V | Potential |
| V1 | First potential |
| V2 | Second potential |
| V21 | Potential of the first bit line 21 |
| V22 | Potential of the second bit line 22 |
| Vblh | Potential for state with logic "1" |
| Vpg | Programming voltage |

DETAILED DESCRIPTION OF ILLUSTRATIVE EMBODIMENTS

Figure 1:
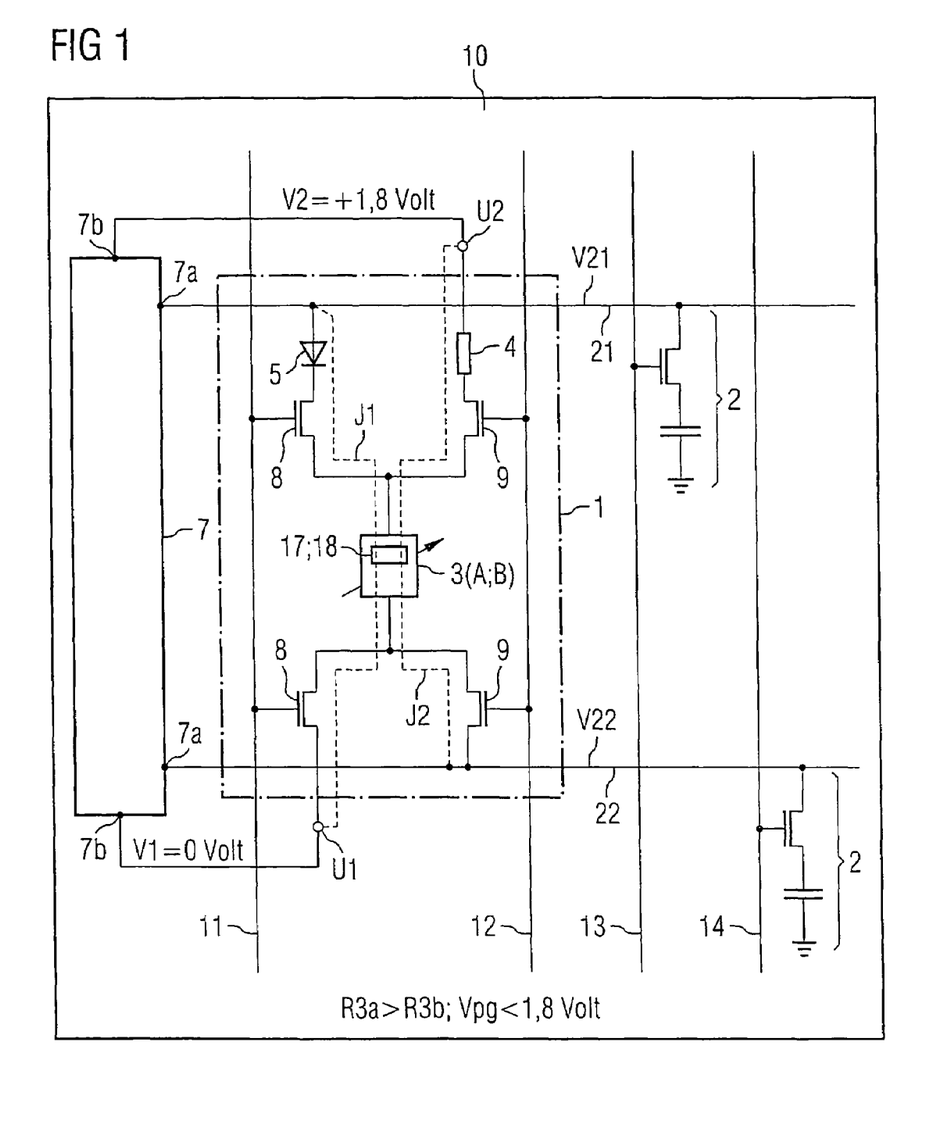
FIG. 1 shows an integrated semiconductor memory with a nonvolatile memory according to the invention in accordance with a first embodiment.

FIG. 1 shows an integrated semiconductor memory 10, into which is integrated a memory cell 1 according to the invention in accordance with a first embodiment. The memory cell 1 is connected to two word lines 11, 12 and also to two bit lines 21, 22. Volatile memory cells 2 each having a selection transistor and a storage capacitor are furthermore connected to the bit lines 21, 22. The memory cells 2 are connected to further word lines 13, 14. The word lines 11, 12 to which the nonvolatile memory cell 1 according to the invention is connected are formed in the same way as the further word lines 13, 14. In particular, they are operated with the same potentials. As a result, the memory cell according to the invention can be integrated into a memory cell array with volatile memory cells 2 with minimal additional outlay.

The memory cell 1 has a programmable component 3, which, depending on the programming state, is either at high impedance (programming state A) or at low impedance (programming state B). The component 3 of the memory cell 1 may be an electrically programmable fuse, that is to say an electrical fusible link, to which a logic "1" can be written once. However, the component 3 may also be any arbitrary other, one-time irreversibly or multiply reversibly programmable component.

Two first switching elements 8 and two second switching elements 9 are provided, which are in each case formed as field effect transistors (MOSFETs), for example as n-channel transistors. The first switching elements 8, the gate electrodes of which are connected to the first word line 11, open a first current path J1 when the first word line 11 is activated, the first current path leading via the two first switching elements 8 and via the component 3. The first current path J1 connects the first bit line 21 to a first potential terminal U1 via the component 3. The second switching elements 9, the gate electrodes of which are in each case connected to the second word line 12, open a second current path J2 leading via the two switching elements and via the component 3. The second current path J2 additionally leads via a protective resistor 4, as a result of which the electrical resistance along the second current path J2 is greater than in the case of the first current path. It is, therefore, possible to obtain larger current intensities with the first current path J1 than in the second current path J2. Therefore, the first current path J1 serves for reprogramming the programmable component 3, to be precise at least when the current path J1 remains opened for a relatively long period of time. In the case where the first current path is only activated momentarily, by contrast, the component 3 is not yet reprogrammed.

A rectifier diode 5 is preferably also provided in the first current path, which diode only permits programming in one direction, for example corresponding to a logic "1", but prevents reprogramming of the component 3 upon application of a programming voltage having an opposite sign (corresponding to a logic "0"). The second current path J2 connects the second bit line 22 to a second potential terminal U2 via the component 3 and the protective resistor 4. Both current paths J1, J2 lead via the programmable component 3. The electrical resistance R3a of the component 3, in a high-impedance first programming state A, is greater than the electrical resistance R3b of the component 3 in the second, low-impedance programming state B.

In FIG. 1, the two bit lines 21, 22 are connected to a differential amplifier 7. The bit lines 21, 22 join input terminals 7a of the differential amplifiers 7. Two output terminals 7b of the differential amplifier 7 are connected to the voltage terminals U1, U2 or themselves form the voltage terminals U1, U2. In this case, the first and the second current path lead from a respective bit line as far as an output terminal 7b of the differential amplifier 7.

The procedure when reading out an item of information from the nonvolatile memory cell 1 is described below. The read-out may also be effected in a testwise manner in order to check the proper programming state of the memory cell 1.

The read-out of the information stored in the memory cell 1, namely which of the programming states A or B is actually present, is effected with the aid of the second current path J2, which can be used for reading or else for testing the component 3. The programmable component may be formed as a fuse or antifuse or in some other way.

Before the programming state of the memory cell 1 that is actually present is read out with the aid of the second current path J2, it is necessary firstly to produce a state in which the two bit lines 21, 22 have unambiguously predetermined electrical potentials which, moreover, differ from one another. It is only afterward that the predetermined different potentials are altered in a targeted manner with the aid of the second current path and, in particular, the sign of the difference between the potentials of the two bit lines is reversed, provided that the memory cell 1 is in the appropriate programming state for this. Depending on whether or not such a reversal of the sign of the difference between the potentials of the two bit lines occurs, it is possible to determine which of the two following programming states A, B of the memory cell 1 is actually present.

The state that is firstly to be produced, in which the two bit lines 21, 22 have unambiguously predetermined electrical potentials that differ from one another, can be achieved by virtue of the first current path J1 firstly being opened temporarily with the aid of the first word line 11. It can also be produced in that, without opening the first current path, the two bit lines are biased in some other way with suitable electrical potentials that differ from one another. This may be effected by means of other terminals, for instance by means of driver circuits or by means of output terminals of a differential amplifier 7. Biasing the bit lines with the aid of a differential amplifier, which is used as a sense amplifier in conventional DRAMs, has the advantage, in particular, that there is no need for any additional terminals for biasing the bit lines. Instead, the output terminals 7b of an existing differential amplifier 7 may be used as terminals U1, U2 or be electrically connected thereto, as illustrated in FIG. 1, it also being possible for electrical resistances to be provided in this electrical connection. Biasing the bit lines with the aid of a differential amplifier is appropriate particularly when the output voltage that can be provided by the differential amplifier suffices for programming the component 3. In other cases, for instance in the case of fuses or antifuses with programming voltages of between 3 and 6 volts, additional measures may be necessary for protecting the input terminals of the differential amplifier against overvoltages.

In order to bias the bit lines with electrical potentials having magnitudes that differ from one another, by way of example, firstly however both bit lines 21, 22 are biased with a precharge potential (of 0.9 volt, for example) by means of a precharge command and a logic "1" is subsequently written onto the first bit line 21. As a result, the electrical potential of the first bit line 21 is increased relative to the precharge potential (to 1.0 volt, for example), whereas the second bit line 22 continues to be at the precharge potential. The mutually different potentials of the two bit lines enable an unambiguous read-out result during the read-out and later amplification with the aid of the differential amplifier 7, the read-out result being inverted or not being inverted prior to amplification, depending on the programming state A or B of the memory cell 1.

After the bit lines 21, 22 have been biased with electrical potentials V21, V22 that differ from one another, the second word line 12 is activated for a certain period of time for the purpose of reading out the programming state of the memory cell 1. The second current path J2 extending from the second bit line 22 as far as the second potential terminal U2 is thereby activated. On account of the protective resistor 4, the programmable component 3 is not reprogrammed in this case. Primarily, however, the potential V22 of the second bit line 22 is raised during read-out, provided that the component 3 is programmed in low-impedance fashion. If the component is a fuse, for example, which has not yet been blown, then the electrical resistance along the second current path J2 is low and the potential V22 of the second bit line 22 is raised to a potential that is greater than the potential V22 of the first bit line 22 at this instant. The potential V22 of the second bit line may in this case be raised at most up to the potential V2 of the second potential terminal U2 of approximately 1.8 volts, for example. As a result of raising the potential V22 of the second bit line 22 beyond the instantaneous potential V21 of the first bit line 21, the sign of the difference between the potentials V21, V22 of the two bit lines 21, 22 is inverted.

If, by contrast, the fuse has already been reprogrammed, that is to say blown, and is thus at high impedance or current-impermeable, the opening of the second current path J2 does not bring about inversion of the potentials of the bit lines 21, 22, since the second current path J2 is interrupted in the region of the fuse or of the already programmed component 3.

Consequently, depending on whether or not the programming state of the component 3 results in inversion, the first bit line is biased with a larger or a smaller potential than the second bit line.

The second word line 12 has to remain activated until it is unambiguously established whether or not the potentials initially situated on the two bit lines 21, 22 are inverted by means of the activated current path. Only then is the second word line 12 closed. A fuse that has not yet been blown has the effect that when the second word line 12 is activated, the potentials of the bit lines 21, 22 are not altered and a logic "1" is read out as the signal of the first bit line 21, which matches the previous bias voltage of the first bit line. A fuse that has not yet been blown, on the other hand, leads, via the second current path J2, to an inversion of the potentials of the bit lines 21, 22 during the activation of the second word line 12. Consequently, a logic "0" is read out as the signal of the first bit line 21.

In order to read from the memory cell 1 or else for testing the state of the E-fuse, it is thus the case that firstly for example a logic "1" is written onto the bit line pair and there is a wait to ascertain whether, during the activation of the second word line 12, the bit line potentials are amplified in accordance with their initial value or are instead amplified in inverted fashion. In the case of inversion of the bit line signals, the latter are altered in such a way that they correspond to a logic "0" after the deactivation of the second word line 12. An inversion of the bit line signals indicates that the component has not yet been reprogrammed, by way of example.

The reprogramming of the component 3 is preferably initiated by means of a read-out operation as described above, firstly the bit lines 21, 22 being biased with potentials that differ from one another and then the second current path J2 being opened temporarily. In addition, however, the first word line 11 is opened once again, to be precise during a relatively long period of time. This period of time is long enough that the component 3 is in this case reprogrammed by means of the first current path J1. If, by way of example, the first bit line 21 can be electrically connected to the potential V1 of an output terminal 7b of the signal amplifier via the first current path J1, then the sign of a potential difference present between the bias voltages V21, V22 of the two bit lines 21, 22, which has already been amplified by the differential amplifier, can be inverted or, if it had already been inverted by the previously opened second current path J2, can be inverted a second time. When the first word line 11 is opened once again, the first current path J1 leading from the first bit line 21 as far as the first potential terminal U1 is activated. As a result, a current caused by the voltage difference of 1.8 volts provided at the outputs of the differential amplifier can flow along the first current path J1, which, if the first word line 11 remains opened during a sufficiently long time duration, reprograms the component and puts it into a high-impedance state A. By way of example, a fuse is blown through sufficiently long activation of the first word line 11. After the reprogramming of the programmable component 3, the first word line 11 is deactivated again. Both when reading from the memory cell 1 and when reprogramming the memory cell 1, the first word line 11 and the second word line 12 are in each case operated in pulsed operation, that is to say are in each case opened only for short periods of time. Consequently, they do not remain permanently activated during the access to the nonvolatile memory cell 1. As a result, the mode of operation of the nonvolatile memory cell differs from the mode of operation of volatile memory cells.

The potentials V1 and V2 of the voltage terminals U1, U2 are only required for the preimpressing of the bit lines. Complete "spreading" of the bit line potentials is not yet necessary during the presensing phase, that is to say the first time segment of a read-out operation. It is not until during the subsequent amplifying during a second time segment of the read-out operation that the bit line potentials V21, V22 are spread. If the bit lines do not have any leakage paths, the differential amplifier can be turned off after spreading. In conventional semiconductor memories with volatile memory cells such as DRAMs, by contrast, the differential amplifier generally remains permanently activated and maintains the spreading.

The memory cell according to embodiments of the invention that is proposed here manages with the conventional addressing and evaluation units already provided for a cell array comprising volatile memory cells. The nonvolatile memory cell 1 according to embodiments of the invention can be integrated in space-saving fashion into a volatile semiconductor memory. The component provided may be of a multiple reversibly reprogrammable switching element and a one-time only irreversibly programmable switching element. In the latter case, the nonvolatile memory cell is a WORM cell (write once read multiple). The component 3 may be an E-fuse, in particular, which is present in an initially unblown state (corresponding to a logic "0") and to which a logic "1" can be written once. As long as the E-fuse has not yet been blown, it brings about, during the read-out of the cell, an inversion of the signals of the bit lines 21, 22 of the bit line pair into a state corresponding to a logic "0". The bit lines of a bit line pair are usually also referred to as "bit line true" and, "bit line complement". The bit line to be read, for example the bit line 21 in the above example, is the "bit line true".

With the aid of the nonvolatile memory cell 1 according to embodiments of the invention, any desired data such as, for example, test results of an electrical functional test of the semiconductor circuit that has the nonvolatile memory cell 1 can be stored, in particular for example, retest pass events, measured test temperatures, current values, trimming values, speed sorting data, E-fuse repair data or any other data desired that are intended to be stored permanently on the chip. The memory content of the nonvolatile memory cell 1 can be accessed by means of special operating modes with the aid of EMRS commands (extended mode register set).

Each pair of bit lines 21, 22 connected to a differential amplifier 7 on a semiconductor circuit may have connected to it one or a plurality of memory cells 1 according to embodiments of the invention, for example in a manner strung together along the respective two bit lines or in arbitrary order alternately with volatile memory cells. The nonvolatile memory cells 1 are preferably arranged between the differential amplifiers 7 and the sections of the bit lines 21, 22 to which the volatile memory cells 2 are connected. The word lines 11, 12 that are in each case closest adjacent to the signal amplifiers 7 thus drive the nonvolatile memory cells 1, whereas the further word lines 13, 14 drive the volatile memory cells that are arranged further away from the signal amplifiers. Uniform driver voltages are provided for all of the word lines 11, 12, 13, 14.

Figure 2:
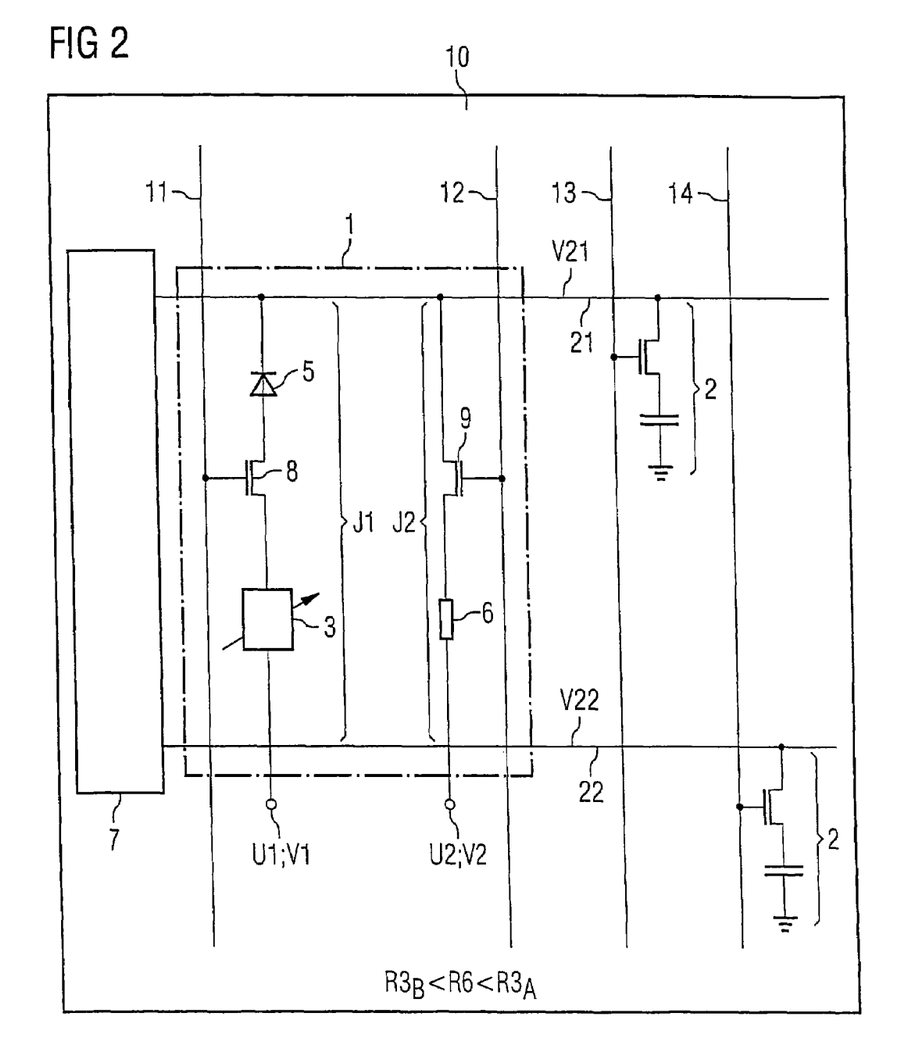
FIG. 2 shows an integrated semiconductor memory with a nonvolatile memory cell according to the invention in accordance with a second embodiment.

FIG. 2 shows an integrated semiconductor memory with a nonvolatile memory cell 1 according to the invention in accordance with another embodiment, which likewise has all the advantages of the nonvolatile memory cell 1 described above with reference to FIG. 1. In accordance with FIG. 2, the nonvolatile memory cell 1 has two current paths J1, J2 that can be activated by a respective switching element 8 and 9 via the word lines 11, 12. The activation of the first word line 11 switches the first switching unit 8 and thus also the first current path J1 into the conducting state. The activation of the second word line 12 switches the second switching unit 9 and thus also the second current path J2 into the conducting state. Both current paths J1, J2 are connected to the same first bit line 21. The memory cell 1 nevertheless extends over a region of two bit lines 21, 22 whose potentials can be inverted by the differential amplifier 7.

In the embodiment in accordance with FIG. 2, the potentials of output terminals of the differential amplifier 7 need not necessarily be used as potential for the potential terminals U1, U2. Instead, the two current paths J1, J2 may also lead to two voltage terminals U1, U2, which are biased with temporally constant potentials V1, V2. By way of example, the first current path J1 leads from the first bit line 21 via a rectifier diode 5, via the first switching element 8 and via the programmable component 3 to a first voltage terminal U1. The latter is biased with a first potential V1, which is greater than the potential V21 of the bit line 21. Furthermore, by way of example, the second current path J2 leads via the second switching element 9 and via a load resistor 6 to a second potential terminal U2, which is biased with a second potential V2, which is less than the potential V21 of the first bit line 21. In this way, the potential of the first bit line 21 can be increased by means of the first current path and the potential of the first bit line 21 can be decreased by means of the second current path J2. In the same way as in FIG. 1, the voltage terminals U1, U2 can be connected to output terminals 7b of the differential amplifier 7 and be biased with the aid of the differential amplifier 7 in the same way as explained with reference to FIG. 1.

In the memory cell 1 from FIG. 2, the second current path J2 does not lead via the programmable component 3, but instead via a load resistor 6, the electrical resistance of which is greater than that of the component 3 in the low-impedance state, but is less than that of the component 3 in the high-impedance state. The opening of the first current path as a result of the first word line 11 being activated temporarily principally serves to ensure that the two bit lines 21, 22 are biased with mutually different electrical potentials before the second current path is opened. If, as in the case of the operation of the memory cell in accordance with FIG. 1, the first word line 11 and the second word line 12 are successively activated for a respectively limited time duration and the respective current paths J1, J2 are thereby opened temporarily one after the other, it is possible, by means of the respective current path, to increase the potential of the first bit line 21 for example above the precharge potential initially present at both bit lines. In this case, the potential of the first bit line is then decreased as a result of the opening of the second current path. Depending on the magnitude of the electrical resistances along the current paths and the potentials V1, V2 of the potential terminals U1, U2, the potential increase brought about by means of the first current path J1 is greater or less in magnitude than the potential decrease in the potential V21 of the first bit line 21 that is brought about by means of the second current path J2. If firstly the first word line 11 and then the second word line 12 are successively activated for a limited time, the final potential V21 of the first bit line 21 that is obtained after the deactivation of the second word line 12 is either higher or lower than before the activation of the first word line, depending on the programming state of the component 3. Consequently, the differential amplifier 7 amplifies either a noninverted or an inverted bit line signal of the bit line 21, 22. Depending on whether or not the signal subsequently read out is inverted, a logic "1" or "0" is read out.

In the same way as during the operation of the nonvolatile memory cell in accordance with FIG. 1, the setting of mutually different bias voltages of the two bit lines can also be achieved during the operation of the memory cell in accordance with FIG. 2 as well in that, instead of opening the first current path by means of the first word line, the first bit line is biased in a different way with a different potential than the precharge potential. This may be done for instance by means of the bit line driver or a dedicated voltage terminal U1. The nonvolatile memory cells in accordance with both FIGS. 1 and 2 are operated in the same way, however, in that during read-out firstly (as a result of briefly opening the first current path or in some other way) mutually different potentials of the two bit lines are set and afterward, as a result of opening the second current path, a potential alteration is performed at one of the two bit lines. The potential difference is then amplified and, if appropriate, also overwritten if reprogramming is envisaged.

Figure 3:
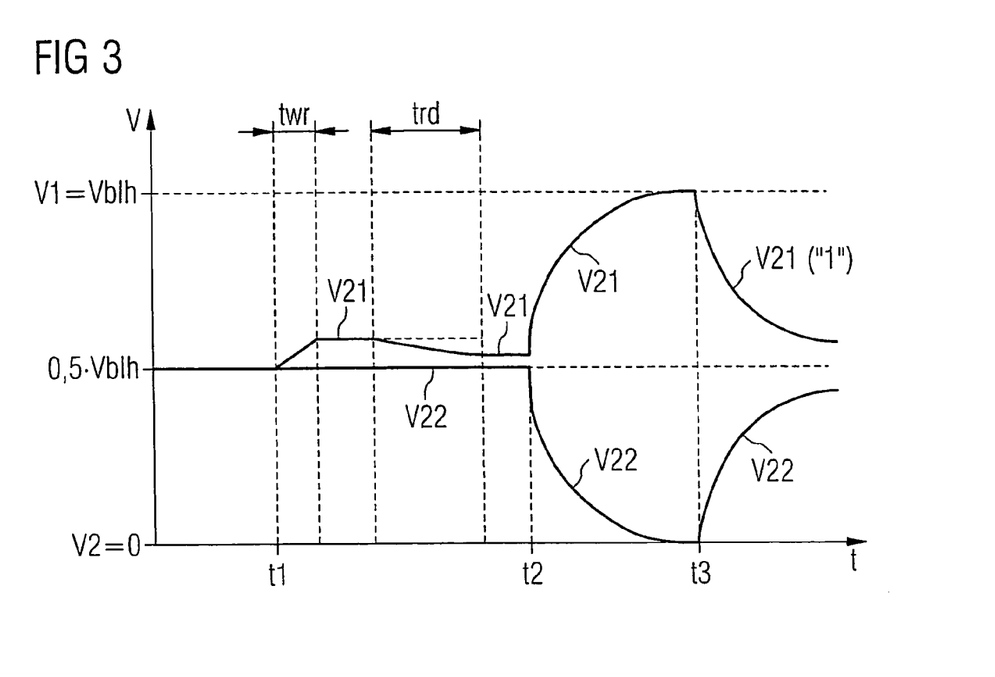
FIG. 3 shows the temporal profile of the bit line potentials when reading from a memory cell according to the invention in accordance with FIG. 2 in the case of a component programmed in low-impedance fashion.

FIG. 3 shows by way of example the profile of bit line potentials when reading from a memory cell 1 in accordance with FIG. 1 or FIG. 2 in the case of a component 3 programmed in low-impedance fashion. The voltage V is plotted as a function of the time t for the bit lines 21, 22. The bit line potentials vary between a potential of 0 V, corresponding to a logic "0" and the potential Vblh, corresponding to a logic "1". Since the stored charge of a cell is distributed between the entire bit line, however, when reading from volatile memory cells, the bit line potentials lie only slightly above or below the magnitude of the precharge potential (0.5 Vblh) with which the bit lines are biased by means of the precharge command.

Figure 4:
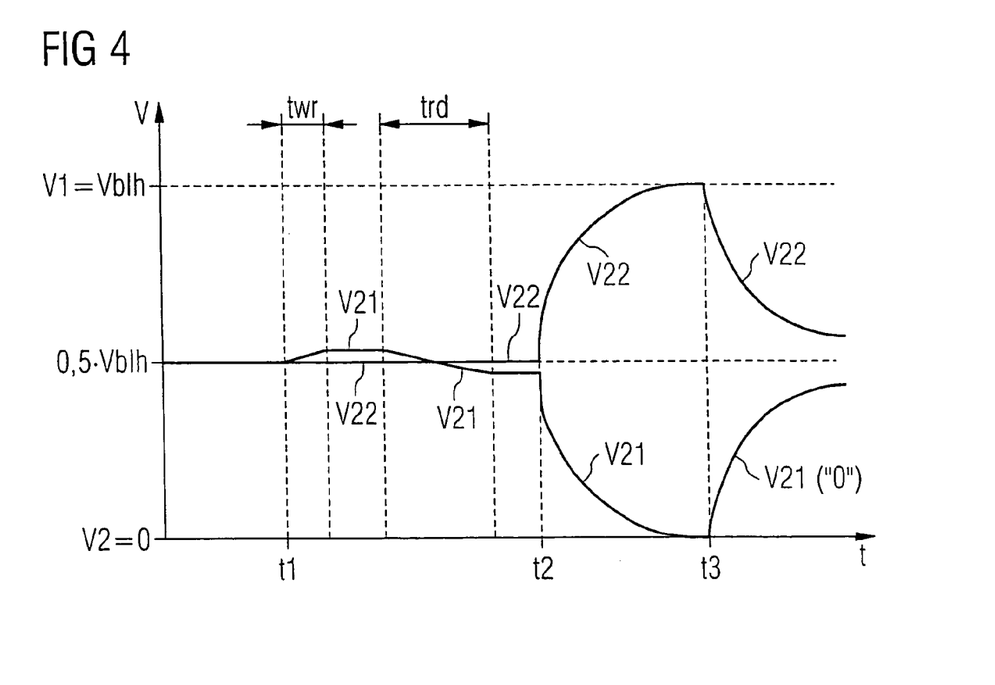
FIG. 4 shows the temporal profile of the bit line potentials when reading from a memory cell according to the invention in accordance with FIG. 2 in the case of a component programmed in high-impedance fashion.
Figure 5:
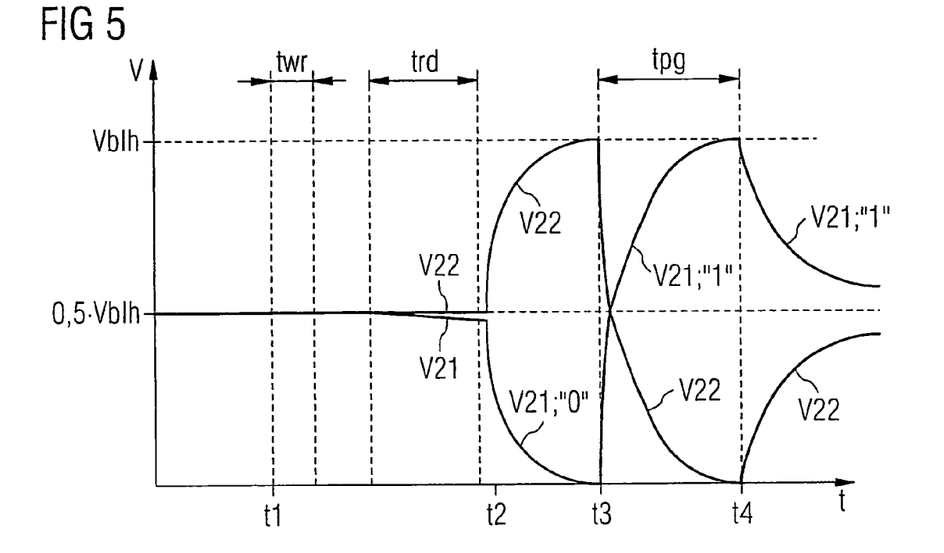
FIG. 5 shows the temporal profile of the bit line potentials when programming the memory cell according to the invention in accordance with FIG. 2.

In FIG. 3 and also FIGS. 4 and 5, V21 designates the potential of the first bit line 21 and V22 designates the potential of the second bit line 22. If the programmable component 3 is programmed in low-impedance fashion in FIG. 1 or 2, then the activation command "activate" carried out in the case of DRAMs, which can also be used in the case of the memory cell according to the invention, has the effect that from the first potential terminal U1 via the first current path J1 with the component 3 programmed in low-impedance fashion, the bit line potential V21, starting from the instant t 1, at which the first switching element 8 is switched into the on state by means of an activation command, to a very rapidly effected rise in the potential V21 of the first bit line 21 until, after a first time duration twr has elapsed, if the first word line 11 is deactivated again, the potential V21 remains constant again. If the second word line 12 is then activated during a second time period trd and the second current path J2 is thereby switched in conducting fashion, the potential V21 falls again, since the bit line 21 is now connected to the smaller potential V2 of the second potential terminal U2 via the second current path J2. Since the electrical resistance of the load resistor 6 is greater than the electrical resistance of the component 3 programmed in low-impedance fashion, the fall in the potential V21 is not as steep as the rise in this potential in the first time period twr. After the deactivation of the second word line 12, the potential remains constant until the instant t at which the presensing phase is superceded by the phase of amplifying the bit line potentials with the aid of the differential amplifier 8. The differential amplifier 7 drives the bit line potentials V21 and V22 apart from one another from the instant t2 through to the instant t3, when it is switched off again. The potential V22 of the second bit line 22 was not altered during the activation of the first word line 11 and the second word line 12, that is to say during the time durations twr and trd, and, at the instant t2, is consequently lower than the potential V21 of the first bit line. Therefore, the potential V21 of the first bit line is increased, which corresponds to a logic "1".

FIG. 4 shows the temporal profile of the bit line potentials for the memory cell 1 according to the invention in accordance with FIG. 2 in the case of a component 3 programmed in high-impedance fashion. In contrast to FIG. 3, only a very small rise in the potential V21 of the first bit line 21 is effected during the activation of the first word line 11 in the time period twr. Upon the subsequent activation of the second word line 12, the potential V21, as in FIG. 3, is reduced on account of the second current path J2, to be precise once again by the same amount. Since, however, in FIG. 4 the previous rise in the potential V21 of the first bit line was only very small owing to the large electrical resistance of the component 3 programmed in high-impedance fashion, the potential V21 falls below the precharge potential of 0.5 Vblh during the second time duration trd, during which the second word line 12 is activated, so that, at the beginning of the amplifying phase at the instant t1, the first bit line 21 is at a smaller potential V21 than the second bit line 22. Therefore, a logic "0" is read out.

FIG. 5 shows the potential profile in the case of the bit line for a memory cell according to the invention in accordance with FIG. 2 in the case of reprogramming the memory cell. The case of a component 3 that is current-impermeable in the programming state programmed in high-impedance fashion was additionally considered here. This can be discerned from the fact that no change in the potential V21 of the first bit line 21 occurs as a result of the activation of the first word line 11 during the first time duration twr. It is only during the second time duration trd, during which the second word line 12 is activated, that the potential V21, as already explained with reference to FIGS. 3 and 4, is decreased, to be precise likewise below the precharge potential as in FIG. 4. This has the effect that a bit line signal corresponding to a logic "0" is read at the instant t2.

It is not until at the instant t3 that the actual operation required for writing is effected, in the case of which the first word line 11 is activated during a third, longer time duration tpg and a programming current is driven along the first current path J1 through the programmable component. As a result, the potentials V21, V22 of both bit lines are inverted, and a logic "1" is stored at the instant t4 if the amplifying phase is ended by the differential amplifier being switched off. In the case of programming, the third time duration tpg during which the first word line 11 remains activated is significantly longer than during the first time duration twr, which serves only for slightly altering the bit line potential V21. In particular, the third time duration tpg is long enough that the current flowing through the programmable component 3 reprograms the component, for example blows the E-fuse.

The read-out operation described with reference to FIG. 5 takes place during an active command. During the presensing phase between the instants t1 and t3, the word lines 11, 12 are in each case opened temporarily (or, as an alternative, during the first time period twr, a defined potential difference between the two bit lines is set in a different manner instead of by activating the first word line and only the second current path is subsequently opened). In both cases above— and additionally for the nonvolatile memory cells in accordance with both FIGS. 1 and 2—after the activation of the second current path, the programming state of the component 3 can be assessed and read out until a subsequent precharge command biases the two bit lines again with a precharge potential and thereby overrides the previous voltage shifts. The amplification, that is to say the so-called "spreading", of the potentials of the two bit lines takes place during the amplifying phase between the instants t2 and t3.

The "spreading" of the bit line potentials that is possible with the aid of the differential amplifier can be used during a writing or programming operation to change the programming state of the component 3. As an alternative, a dedicated current supply path may also be provided for this purpose. In this case, the programming duration tpg corresponds to an externally applied writing window duration between a write command and a precharge command.

Figure 6:
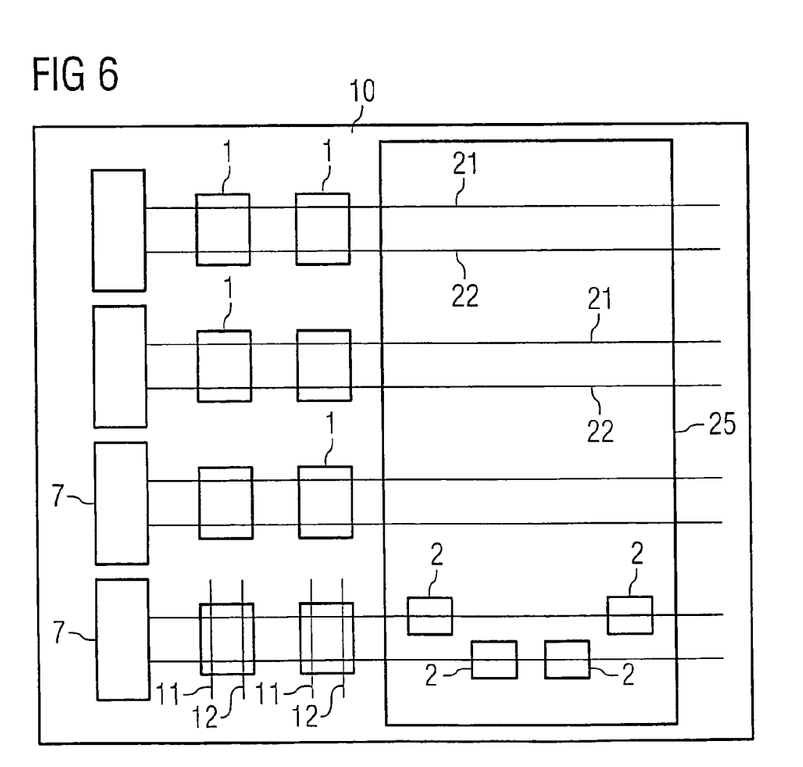
FIG. 6 shows a semiconductor memory having a cell array comprising a multiplicity of volatile memory cells and also a plurality of nonvolatile memory cells according to the invention.

FIG. 6 schematically shows a semiconductor memory 10 having a cell array 25 comprising a multiplicity of volatile memory cells 2. The volatile memory cells 2 may be formed as in FIG. 1. In addition, the semiconductor memory 10 in accordance with FIG. 6 also has nonvolatile memory cells 1 according to the present invention, which are arranged between the memory cell array 25 of the volatile memory cells 2 and the differential amplifiers 7, to which pairs of bit lines 21, 22 are connected in each case. The volatile memory cells 2 and the nonvolatile memory cells 1 according to the invention are thus driven by the same bit lines 21, 22. However, dedicated word lines 11, 12 are provided for the nonvolatile memory cells 1, but these word lines are formed in the same way as remaining word lines that drive the volatile memory cells 2. In particular, the word lines 11, 12 are driven with the same potentials as the further word lines that drive the volatile memory cells 2. Only the control timing when driving the word lines 11, 12 is altered compared with the remaining word lines. FIG. 6 shows that, per bit line pair, it is also possible for a plurality of nonvolatile memory cells 1 according to the present invention to be provided and be arranged for example in direct proximity to the differential amplifier 7. FIG. 6 shows that the memory cells according to the invention can be integrated in space-saving fashion on a semiconductor memory actually intended for volatile charge storage, in order to permanently store any desired data, for example chip-specific test data.

With the aid of the present invention, volatile and non-volatile memory cells can be arranged in an arbitrary manner jointly in a single memory cell array which is driven by only one type of bit lines and word lines.

What is claimed is:

1. A memory device comprising:
   a first bit line disposed over a semiconductor body;
   a second bit line disposed over the semiconductor body; and
   a memory cell coupled to at least one of the first bit line and/or the second bit line, the memory cell including a programmable component having an electrical resistance that depends on a programming state, the programmable component comprising at least one first switching element, which has a control electrode coupled to a first word line, and also comprising at least one second switching element, which has a control electrode coupled to a second word line;
   wherein the at least one first switching element opens a first current path when the first word line is activated, said first current path leading from one of the first or second bit lines via the programmable component as far as a first potential terminal, and
   wherein the at least one second switching element opens a second current path when the second word line is activated, said second current path leading from one of the two bit lines as far as a second potential terminal.

2. The memory device as claimed in claim 1, wherein the programmable component is at high impedance in a first programming state and at low impedance in a second programming state.

3. The memory device as claimed in claim 1, wherein the programmable component comprises a one-time irreversibly programmable component.

4. The memory device as claimed in claim 3, wherein the programmable component comprises an electrically programmable fuse or antifuse.

5. The memory device as claimed in claim 1, wherein the programmable component comprises a repeatedly reversibly reprogrammable component.

6. The memory device as claimed in claim 5, wherein the programmable component comprises a magnetic memory medium or a phase change medium.

7. The memory device as claimed in claim 1, wherein the programmable component comprises current-impervious in a high-impedance programming state.

8. The memory device as claimed in claim 1, wherein the first current path leads from the first bit line to the first potential terminal and the second current path leads from the second bit line to the second potential terminal.

9. The memory device as claimed in claim 1, wherein both the first current path and the second current path lead via the programmable component, the programmable component being coupled in series between two first switching elements in the first current path and being coupled in series between two second switching elements in the second current path.

10. The memory device as claimed in claim 1, wherein the first and the second bit line are coupled to a differential amplifier that amplifies a difference between electrical potentials of the first and of the second bit line and that provides a first and a second potential at two output terminals.

11. The memory device as claimed in claim 10, wherein the two current paths are assigned to the two output terminals of the differential amplifier such that an existing potential difference between the potentials of the first and of the second bit line is inverted by the second current path when the programmable component is switched an low-impedance state.

12. The memory device as claimed in claim 10, wherein the first and the second potential terminals are the output terminals of the differential amplifier.

13. The memory device as claimed in claim 1, wherein the second current path includes a protective resistor that prevents a programming of the programmable component via the second current path.

14. The memory device as claimed in claim 1, wherein the first current path includes a rectifier diode that permits a programming of the programmable component via the first current path only in one current direction.

15. The memory device as claimed in claim 1, wherein both the first current path and the second current path lead from a same bit line to one respective potential terminal in the two potential terminals.

16. The memory device as claimed in claim 1, wherein the first current path leads via the programmable component and the second current path leads via a load resistor instead of via the programmable component, the electrical resistance of said load resistor being less than that of the programmable component in the high-impedance programming state, but greater than that of the programmable component in the low-impedance programming state.

17. The memory device as claimed in claim 1, wherein the first current path couples the fast bit line to the first potential terminal and the second current path couples the first bit line to the second potential terminal, the two potential terminals being biased during operation of the memory cell such that the magnitude of the potential of the first bit line lies between the potential of the first potential terminal and the potential of the second potential terminal.

18. The memory device as claimed in claim 1, wherein the memory device comprises a nonvolatile memory cell that is integrated into a volatile semiconductor memory.

19. The memory device as claimed in claim 18, wherein the nonvolatile memory cell is arranged alongside a cell array comprising a multiplicity of volatile memory cells.

20. The memory device as claimed in claim 1;

wherein the memory device comprises a nonvolatile memory cell that is coupled to at least one of two bit lines to which a respective multiplicity of volatile memory cells is connected.

21. The memory device as claimed in claim 20, wherein the nonvolatile memory cell is coupled to two bit lines leading from the volatile memory cells to two input terminals of a differential amplifier and is arranged between the volatile memory cells and the differential amplifier.

22. The memory device as claimed in claim 1, wherein the memory device further comprises a memory cell array having a multiplicity of volatile memory cells, ones of the volatile memory cells being coupled to the first bit line and/or the second bit line.

* * * * *